United States Patent [19]

Young

[11] Patent Number: 5,039,959
[45] Date of Patent: Aug. 13, 1991

[54] PHASE SWITCHING CIRCUIT

[75] Inventor: James P. Young, Cedar Rapids, Iowa

[73] Assignee: Rockwell International Corporation, El Segundo, Calif.

[21] Appl. No.: 586,635

[22] Filed: Sep. 20, 1990

[51] Int. Cl.$^5$ .............................................. H03C 3/00
[52] U.S. Cl. ...................................... 332/105; 332/103
[58] Field of Search ............... 332/100, 103, 105, 144, 332/146; 307/571, 582, 583, 262, 594; 375/67

[56] References Cited

U.S. PATENT DOCUMENTS

| | | | |
|---|---|---|---|
| 3,401,359 | 9/1968 | Becker | 332/105 |
| 3,590,285 | 6/1971 | Hargrove | 307/295 |
| 4,002,930 | 1/1977 | Miura | 307/262 |
| 4,450,372 | 5/1984 | Diamand | 307/511 |
| 4,558,291 | 12/1985 | Nichols | 333/138 |
| 4,578,629 | 3/1986 | Degenford et al. | 323/217 |
| 4,733,203 | 3/1988 | Ayasli | 333/139 |

FOREIGN PATENT DOCUMENTS 1562003  1/1970  Fed. Rep. of Germany.

Primary Examiner—David Mis
Attorney, Agent, or Firm—John J. Horn; M. Lee Murrah; H. Fredrick Hamann

[57] ABSTRACT

A phase switching circuit adapted for high frequency applications which is operative for shifting the phase of an input signal either by 0° or 180° in response to a control signal. The switching circuit includes two FETs which are coupled together so as to operate in combination to produce the desired phase switching action. The first FET comprises a grounded gate amplifier while the second FET may be configured either as an inverting amplifier or a source follower by changing the polarity of the power supply voltage applied to its output terminal. The two FETs operate in a complimentary fashion so as to provide relatively constant amounts of phase shift and gain.

12 Claims, 2 Drawing Sheets

PHASE SWITCHING CIRCUIT

BACKGROUND OF THE INVENTION

The present invention relates to phase shifting circuits in which the phase of a signal may be changed in response to a control input and, more specifically, to circuits for use in high frequency applications for switching the phase of a signal by 180°.

Many types of electronic equipment require the phase of an input signal to be shifted or switched by 180°. In particular, for certain high frequency applications such as adaptive antennas and bi-phase modulators, phase switching circuits are required which are of small size, low component count and low cost. Furthermore, these circuits must feature low noise figures, constant input impedance, and consistent high gain both between phase positions and over extended frequency ranges.

Referring now to FIG. 1A, a typical prior art split-load phase invertor circuit 10 of the type commonly used in high frequency applications is shown. An input signal $RF_{IN}$ is coupled over the line 11 to the gate of the field effect transistor or FET 12 while the drain of the FET 12 is connected through a resistor 13 to a source voltage $V_{DS}$. The drain of the FET 12 is also coupled over the line 14 to provide a signal S2 and the source of the FET 12 is coupled over the line 15 to provide a output signal S1 and connected through resistor 16 to ground. In operation, the FET 12 conducts current in response to the voltage on applied to its gate causing voltage drops to occur across the resistors 13 and 16 and generating the signals S1 and S2 which are 180° out of phase with respect to each other. The switch 17 selects between the signals S1 and S2 in furnishing the output $RF_{OUT}$ of the circuit 12. However, the split-load phase invertor circuit 10 does not provide low-noise or constant gain and requires 2 to 6 transistors to be implemented in an MMIC.

Referring now to FIG. 1B, a passive phase-shift circuit 20 also typical of the prior art is shown which includes phase-lag and phase-lead networks 21 and 22 comprising alternate signal paths between the input and output terminals of the circuit. A pair of switches 23 and 24 are used to direct an input signal $RF_{IN}$ through one or the other of the filter networks 21 and 22 and furnish an output signal $RF_{OUT}$ which may be switched 180° in phase depending on the network 21 or 22 through which the input signal is directed. Alternatively, one of the networks 21 or 22 may simply comprise a 180° long transmission line while the other network provides 0° phase delay. In any event, the circuit 20 requires a great deal of space to implement the necessary switches, filters or delay lines and does not provide any gain. Further, the circuit 20 only performs the phase shift with a constant output signal over a narrow range of frequencies.

It is therefore an object of the present invention to provide a phase switching circuit for use in high frequency applications which is of small size and has a low component count so as to provide a simple interface for switching the phase of a signal by 180°.

It is another object of the present invention to provide a phase switching circuit featuring high gain characteristics and constant input impedance which are consistent regardless of phase switching.

It is a further object of the present invention to provide a phase switching circuit which provides consistent gain and phase characteristics over a range of frequencies and which can be produced at low cost.

It is yet another object of the invention to provide a phase switching circuit for use in conjunction with the adaptive antennas employed in GPS (Global Positioning System) communications at the $L_1$ and $L_2$ GPS frequencies.

SUMMARY OF THE INVENTION

The present invention constitutes a phase switching circuit operative for shifting the phase of an input signal either by 0° or 180° in response to a control signal. The switching circuit includes two FETs which are coupled together so as to operate in combination to produce the desired phase switching characteristics. The first FET comprises a grounded gate amplifier while the second FET may be configured either as an inverting amplifier or a source follower by changing the polarity of the power supply voltage applied to its output terminal. The two FETs operate in a complimentary fashion so as to provide relatively constant amounts of phase shift and gain in the output of the circuit.

DESCRIPTION OF THE PREFERRED EMBODIMENT

Figure 1A:
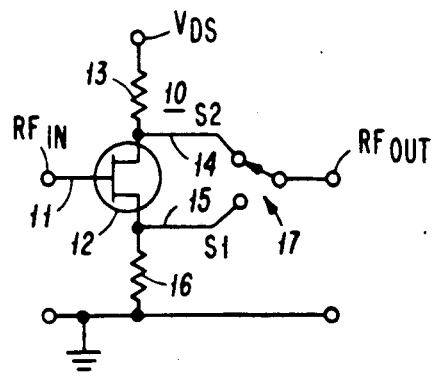
FIGS. 1A and 1B provide schematics of typical prior art phase switching circuits.
Figure 1B:
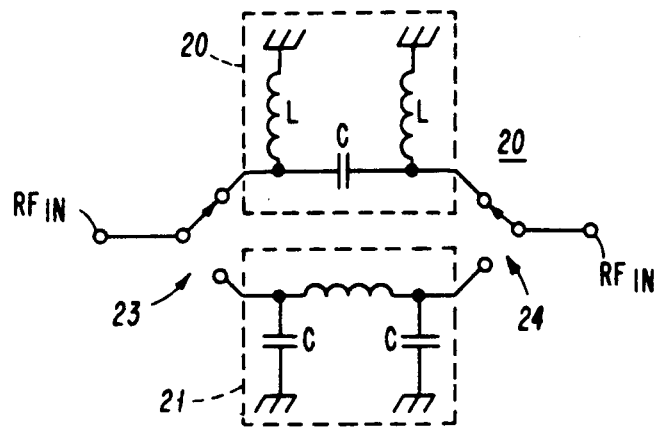
Figure 2:
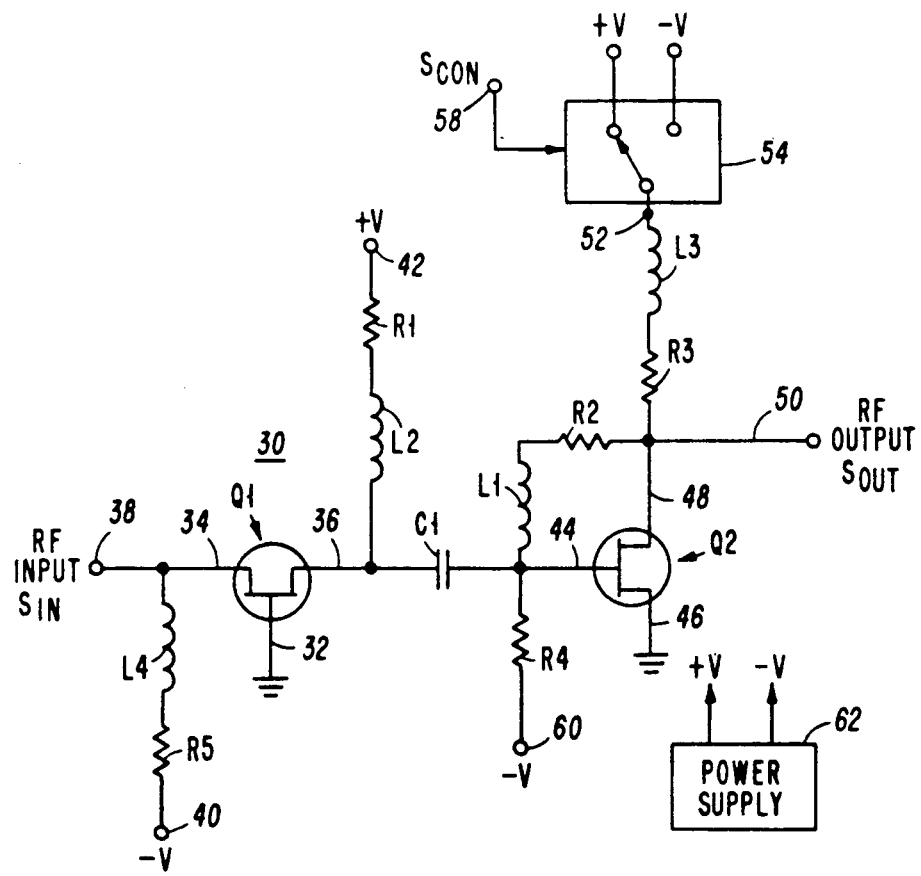
FIG. 2 provides a schematic of a phase switching circuit in accordance with the principles of the present invention.

Referring now to FIG. 2, the present invention constitutes a phase switching circuit 30 having two stages comprised of the FETs Q1 and Q2. The FETs Q1 and Q2 comprise GaAs devices having symmetrical constructions so that source and drain are defined by the current flow through the devices. This symmetrical construction is of importance to the operation of the FET Q2, however, complete symmetry is not strictly required. The FET Q1 is configured as a grounded gate amplifier with its gate 32 connected directly to ground and with its source 34 connected to the terminal 38 for receiving the input signal $S_{IN}$ to the circuit 30 and its drain 36 connected for furnishing output to the FET Q2. The resistors and inductors R5 and L4 and R1 and L2 provide the required DC biasing, isolation and loading on the source 34 and drain 36, respectively, of the FET Q1 with respect to the supply voltages $-V$ and $+V$ from voltage source 62 applied to the terminals 40 and 42.

The output of the FET Q1 is coupled to the input of the FET Q2 through the capacitor C1 which provides DC isolation between the stages of the circuit 30 and is applied to the gate 44 of the FET Q2. The FET Q2 has one of its channel terminals 46 connected directly to ground while its other channel terminal 48 is connected directly to the output terminal 50 for the circuit 30. It should be noted that reference is made to "channel terminals" because of the dual role of the opposing channel connections in the FET Q2 as source and drain and drain and source in accordance with the configuration of the circuit as either a source follower or an inverting amplifier. The channel terminal 48 is also coupled to the power supply 62 through the switch 54 whereby either a positive supply voltage +V or a negative supply voltage −V may be applied to the node 52 for biasing the channel terminal 48 in response to a control signal $S_{CON}$ provided to the switch 54 on the terminal 58.

The resistor R3 and inductor L3 provide the required DC biasing, isolation and loading on the channel terminal 48 of the FET Q2 with respect to the supply voltages +V and −V applied to node 52. The resistor R4 provides the primary DC biasing for the gate 44 of the FET Q2 with the respect to the supply voltage −V from voltage source 62 applied to the terminal 60. The resistor R2 and inductor L1 provide a path for negative feedback which promotes stable DC biasing of the gate 44 and also serve to compensate for parasitic capacitances associated with the construction of the FET itself.

In operation the input signal $S_{IN}$ is applied to input terminal 38 and amplified by the FET Q1 which provides a consistent level of input impedance which is translated to a high output impedance in accordance with the grounded gate configuration of the device. The output of the FET Q1 is connected to the input of the FET Q2 which either operates as an inverting amplifier or a source follower in response to the polarity of the supply voltage applied to the node 52 by operation of the switch 54 in response to the signal $S_{CON}$ on the terminal 58.

When a positive +V supply voltage is applied to the node 52, FET Q2 operates as an inverting amplifier shifting the phase of the signal $S_{IN}$ by 180° and providing an output signal $S_{OUT-IA}$ which is approximately 180° out-of-phase with the signal produced when the circuit operates as a source follower. When a negative −V supply voltage is applied to the node 52, FET Q2 operates as a source follower shifting the phase of the signal $S_{IN}$ by 0° and providing an output signal $S_{OUT-SF}$ which is approximately 180° out-of-phase with the signal produced when the circuit operates as an inverting amplifier. The FETs Q1 and Q2 operate in a complimentary fashion since the high output impedance provided by the FET Q1 allows for a larger voltage gain in Q1 when FET Q2 is configured as a source follower (having high input impedance but lower voltage gain), and allows for lesser voltage gain in FET Q1 when FET Q2 is configured as an inverting amplifier (having low input impedance but higher voltage gain). The overall result in either configuration is approximately equivalent voltage gain through the circuit 30 regardless of its configuration as an inverting amplifier or source follower.

Figure 3:
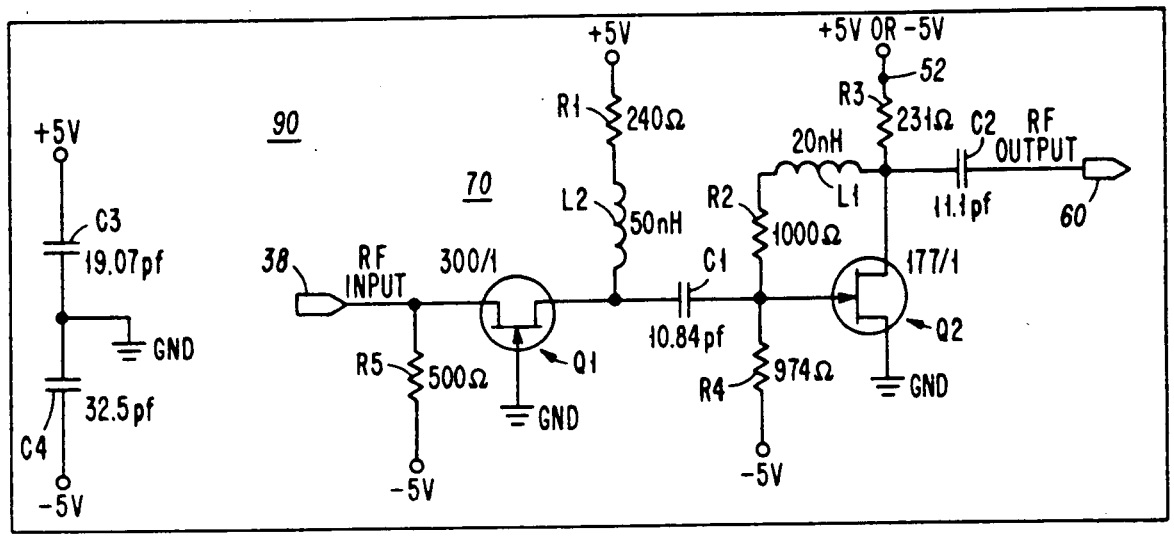
FIG. 3 provides a schematic of a phase switching circuit in accordance with the principles of the present invention with exemplary values shown for individual elements of the circuit.
Figure 4A:
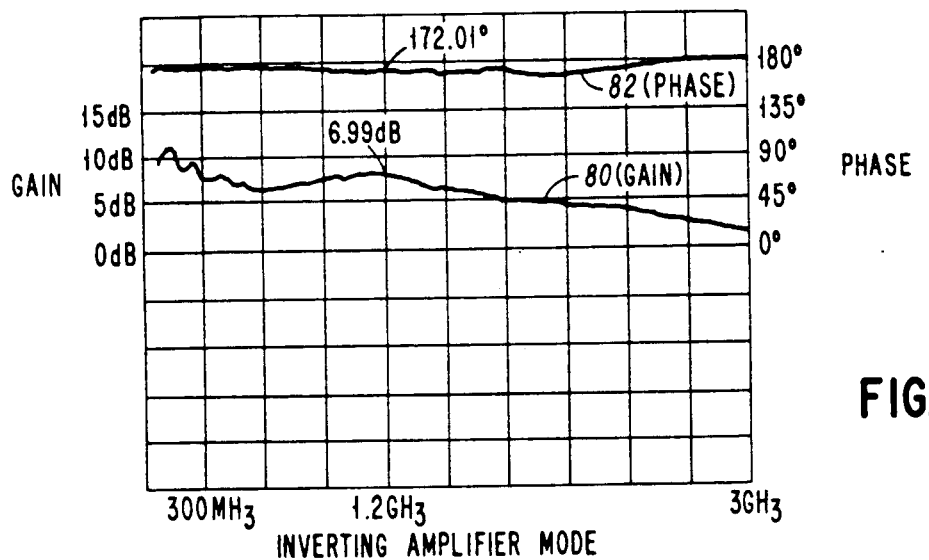
FIGS. 4A and 4B provide graphs of output from the phase switching circuit of FIG. 3.
Figure 4B:
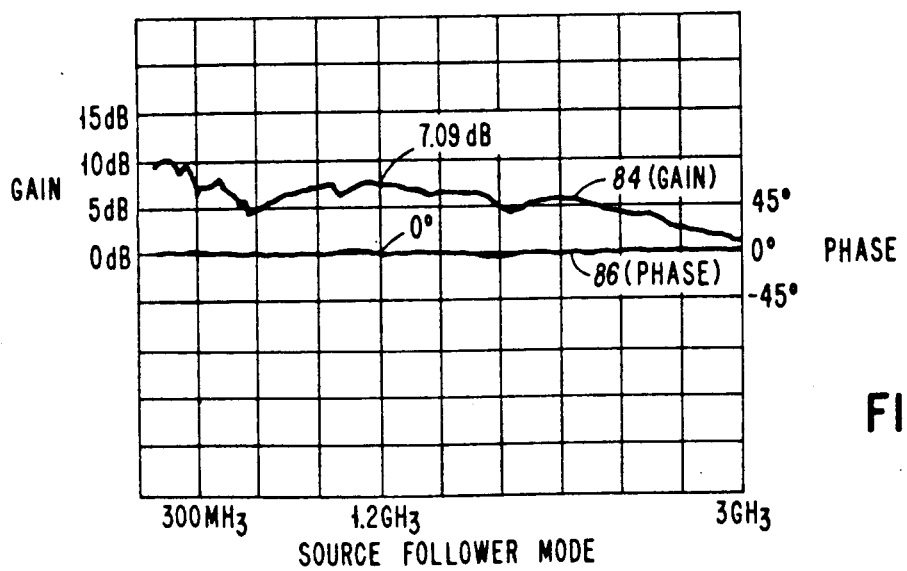

Referring now to FIG. 3, a phase switching circuit 70 is shown whose performance is illustrated in FIGS. 4A and 4B. The circuit 70 again includes the FET Q1 configured as a grounded gate amplifier and the FET Q2 which may be configured either as an inverting amplifier or a source follower in accordance with the polarity of its supply voltage. In comparison with the circuit 30 of FIG. 2, the inductors L3 and L4 of circuit 30 are absent and the (output) coupling capacitor C2 and bypass capacitor C3 and C4 have been added. The circuit 70 provides a slightly different arrangement of the auxiliary components which furnish the required biasing, coupling and isolation for the FETs Q1 and Q2 but functions in a substantially identical manner to circuit 30.

It may be noted that the input to the source 34 of the FET Q1 is biased at approximately 0.3 volts DC. The FETs Q1 and Q2 comprise depletion mode FETs with pinch-off voltages of −2.0 volts having IDSS values of 0.2 milliamps per micron of gate width and an $F_T$ of approximately 18 GHz. FETs Q1 and Q2 were realized on a single MMIC (monolithic microwave integrated circuit) 90 whereby parasitic compacitances were minimized although good performance the circuit as a hybrid. The FET Q1 was constructed with a gate width of 300 microns and length of 1 micron while the FET Q2 was constructed with a gate width of 177 microns and length of 1 micron.

The graphs shown in FIGS. 4A and 4B depict the performance of the circuit 70 shown in FIG. 3 as measured with a spectrum analyzer across an extended frequency range from <300 MHz to 3 GHz including the GPS (Global Positioning System) signal frequencies $L_1$ and $L_2$ (1.57542 and 1.2276 GHz). It should be noted that with the FET Q2 in the source follower mode the phase was defined to be at 0° so that the phase data is relative to the source follower mode. The plots 80 and 84 show gain data while the plots 82 and 86 show phase data. As illustrated, the circuit 70 features relatively constant gain and phase performance over approximately a decade of frequency range regardless of mode and phase shift indicating that the circuit 70 would, for example, be highly useful in switching applications for GPS adaptive antenna arrays.

While particular embodiments of the present invention have been shown and described, it should be clear that changes and modifications may be made to such embodiments without departing from the true scope and spirit of the invention. It is intended that the appended claims cover all such changes and modifications.

I claim:

1. A phase switching circuit, comprising:
   a first FET configured as a grounded gate amplifier and having its source connected for receiving said input signal;
   a second FET having its gate coupled to the drain of said first FET and having a first channel terminal coupled to ground while a second channel terminal is coupled to a power supply means through a switching means and connected for providing the output of said circuit;
   power supply means connected to said switching means for providing a positive polarity supply voltage and a negative polarity supply voltage; and
   switching means connected to said second channel terminal for supplying either said positive or said negative polarity supply voltage to said second FET in response to a control signal so as to thereby control the phase of said output of said circuit.

2. The circuit of claim 1, further including a resistor and inductor connected in series between the gate of said second FET and the second channel terminal of said second FET for reducing the effects parasitic capacitances and providing feedback to promote stable DC biasing.

3. The circuit of claim 1, further including a capacitor connected between said drain of said first FET and said gate of said second FET for capacitively coupling said FETs.

4. The circuit of claim 1, wherein said FETs are fabricated on a single MMIC.

5. A method for phase modulating a carrier signal, comprising the steps of:
   passing said carrier signal through a first FET configured as a grounded gate amplifier;
   passing said carrier signal through a second FET which may be configured either as an inverting amplifier or a source follower by inverting the polarity of a power supply voltage applied across the channel terminals of said second FET; and
   regulating the polarity of said supply voltage in response to a control signal.

6. The method of claim 5, further including the step of:
   compensating for parasitic capacitances and promoting stable DC biasing in said second FET by feeding back part of the output of said second FET to its input through a series connected inductor and resistor.

7. The method of claim 5, further including the step of:
   coupling the output of said first FET to said second FET through a capacitor in order to provide DC isolation between said FETs.

8. A phase shifting circuit, comprising:
   a first FET configured as a grounded gate amplifier;
   a second FET configurable either as an inverting amplifier or as a source follower by inverting the polarity of a supply voltage applied across its channel terminals;
   means for switching the polarity of said supply voltage in response to a control signal.

9. The circuit of claim 8, further including a resistor and a inductor connected between the output and input of said second FET in order to compensate for parasitic capacitances and provide feedback in order to promote stable DC biasing.

10. The circuit of claim 8, further including a capacitor for coupling the output of said first FET to the input of said second FET while providing DC isolation between said FETs.

11. The circuit of claim 8, wherein said FETs are fabricated on a single MMIC.

12. The circuit of claim 10, wherein said first FET has negative and positive supply voltages applied to its source and drain, respectively, through resistors and inductors which are adapted for providing DC biasing and isolation.

* * * * *